(12) United States Patent
Brady

(10) Patent No.: US 6,535,436 B2
(45) Date of Patent: Mar. 18, 2003

(54) REDUNDANT CIRCUIT AND METHOD FOR REPLACING DEFECTIVE MEMORY CELLS IN A MEMORY DEVICE

(75) Inventor: James Brady, The Villages, FL (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/790,370

(22) Filed: Feb. 21, 2001

(65) Prior Publication Data

US 2002/0113251 A1 Aug. 22, 2002

(51) Int. Cl.$^7$ ................................................. G11C 7/00
(52) U.S. Cl. ............. 365/200; 365/230.01; 365/230.03; 365/230.06; 365/189.07
(58) Field of Search ........................ 365/230.01, 230.03, 365/230.06, 189.01, 189.07, 200

(56) References Cited

U.S. PATENT DOCUMENTS

| | | | |
|---|---|---|---|
| 4,598,388 A | 7/1986 | Anderson | 365/200 |
| 4,672,581 A | 6/1987 | Waller | 365/200 |
| 5,163,023 A | 11/1992 | Ferris et al. | 365/200 |
| 5,537,665 A | 7/1996 | Patel et al. | 395/182.03 |
| 5,764,587 A | 6/1998 | Buettner et al. | 365/230.06 |
| 5,801,986 A | 9/1998 | Matsumoto et al. | 365/185.09 |
| 5,953,267 A | 9/1999 | Oh | 365/200 |
| 5,963,489 A | 10/1999 | Kirihata et al. | 365/200 |
| 6,157,584 A | * 12/2000 | Holst | 365/200 |

FOREIGN PATENT DOCUMENTS

| | | | |
|---|---|---|---|
| EP | 0 795 825 A2 | | 9/1997 |
| JP | 408077793 | * | 3/1996 |
| JP | 363079300 A | * | 4/1998 |
| JP | 02001291395 A | * | 10/2001 |
| WO | WO 98/28746 | | 7/1998 |

* cited by examiner

*Primary Examiner*—Viet Q. Nguyen
(74) *Attorney, Agent, or Firm*—Lisa K. Jorgenson; Andre Szuwalski

(57) ABSTRACT

A memory device having redundancy is disclosed. The memory device includes an array of memory cells organized into rows and columns of memory cells, each row of memory cells including a plurality of addressable memory cells and redundant memory cells, the array of memory cells including row lines and column lines, each row line being coupled to memory cells in a distinct row of memory cells, each column line being coupled to memory cells in a distinct column of memory cells, and column input/output lines. The memory device further includes a redundancy circuitry for selectively coupling column lines to column input/output lines of the array of memory cells and selectively decoupling at least one column line from the column input/output lines, based upon an address value received by the memory device during a memory access operation.

45 Claims, 11 Drawing Sheets

REDUNDANT CIRCUIT AND METHOD FOR REPLACING DEFECTIVE MEMORY CELLS IN A MEMORY DEVICE

BACKGROUND OF THE INVENTION

1. Technical Field of the Invention

The present invention relates to redundancy circuitry for semiconductor memory devices, and particularly to row/column redundancy circuitry for random access memory (RAM) devices.

2. Description of the Related Art

Processing defects in static random access memory (SRAM) and dynamic random access memory (DRAM) devices can significantly reduce the processing yield in large scale memory arrays. In order to improve the processing yield of memory chips, various methods of error correction have been created. These include 'soft' error correcting whereby software corrects for physical defects, and 'hard' error correcting whereby defective circuit elements are replaced with redundant elements included on the chip. The use of soft or hard error correcting can result in lower chip manufacturing costs and earlier introduction of new products on existing wafer fabrication lines or in new process technologies.

Yield enhancement by 'hard' error correcting on a memory chip is typically produced by including redundant rows and/or columns within the memory array. A few redundant rows or columns can significantly enhance yield of a memory circuit since many devices are rejected for single bit failure or failures in a single row or column. These redundant rows or columns can be added to the memory design to replace defective rows or columns which are identified at electrical test after wafer processing.

To replace a defective memory row or column, the defective row or column is first disconnected from the array. This is accomplished by one of three methods: current blown fuses, laser blown fuses, and laser annealed resistor connections. Then a redundant row or column is enabled and programmed with the defective row or column address.

Although this use of redundant rows and columns of memory cells increases product yield, the additional number of redundant columns/rows of memory cells necessary to bypass a number of defects noticeably increases the amount of silicon space devoted to the redundant columns/rows. Based upon the foregoing, there is a need for replacing defective memory cells without substantially increasing layout size and/or circuit overhead.

SUMMARY OF THE INVENTION

The present invention overcomes the shortcomings in prior memory devices and satisfies a significant need for a memory device that more efficiently bypasses defective memory cells in the memory device. According to a preferred embodiment of the present invention, a memory device includes an array of memory cells organized into rows and columns of memory cells. Each row of memory cells includes one or more redundant memory cells. The array of memory cells includes row lines and column lines, with each row line being coupled to memory cells in a distinct row of memory cells and each column line being coupled to memory cells in a distinct column of memory cells, and column input/output lines. The memory device further includes an address decoder for receiving an address value during a memory access operation, selecting a row of memory cells and a coupling a plurality of column input/output lines to the data input/output terminals of the memory device, based upon the received address value. The memory device includes redundancy circuitry for selectively coupling column lines to column input/output lines of the array of memory cells and selectively decoupling at least one column line from the column input/output lines, based upon the received address value. In this way, the redundancy circuitry is capable of selectively decoupling from the column input/output lines a column line associated with a defective memory cell, and coupling to the column input/output lines a column line associated with a redundant memory cell.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Referring to FIGS. 1–10 there is shown a memory device 1 having redundant circuitry for use in bypassing defective memory cells in memory device 1. Memory device 1 is a random access memory (RAM) device. It is understood that memory device 1 may be virtually any type of RAM device, such as a dynamic random access memory (DRAM) and a static random access memory (SRAM).

Figure 1:
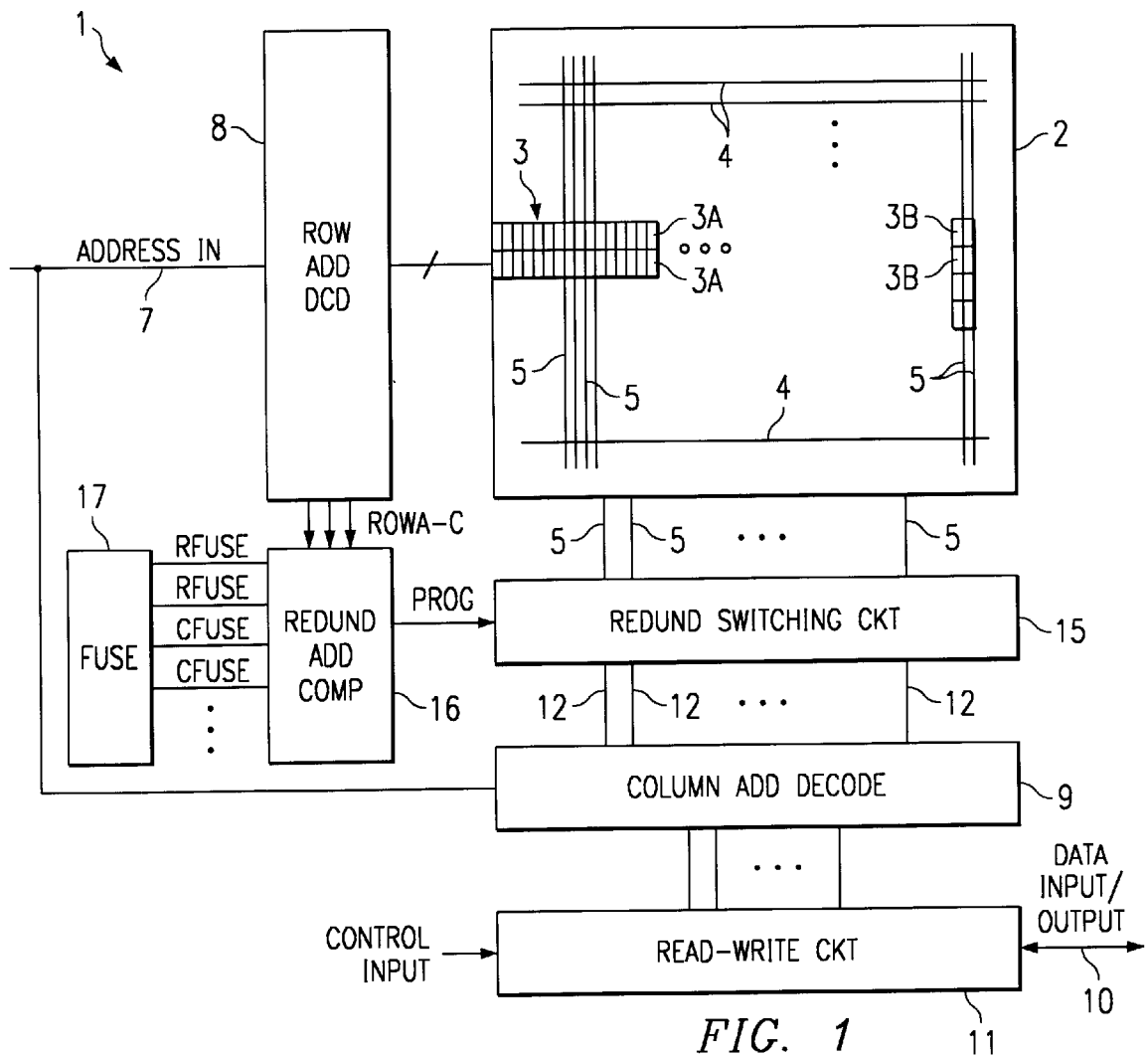
FIG. 1 is a block diagram of a memory device according to an embodiment of the present invention.

Memory device 1 includes an array 2 of memory cells 3 that are organized into rows and columns of memory cells 3. Array 2 further includes a plurality of row lines 4, with each row line 4 being connected to memory cells 3 in a distinct row of memory cells. Each row of memory cells 3 includes addressable memory cells 3A that are initially configured as addressable and/or accessible memory cells for storing and retrieving data therefrom, and a plurality of redundant memory cells 3B for replacing addressable memory cells 3A that are found to be defective. The redundant memory cells 3B may be disposed in columns of memory cells at an end of array 2, as shown in FIG. 1. In this way, the columns of redundant memory cells 3B may be used to replace defective memory cells in any one or more rows of memory cells 3.

Array 2 may further include a plurality of column lines 5, with each column line 5 being connected to memory cells in a distinct column of memory cells. As shown in FIG. 1, each column line 5 extends from an end of array 2 for accessing data placed on column lines 5.

Array 2 will be described for exemplary purposes as having 64 rows of memory cells 3, with each row having 256 addressable memory cells 3A and eight redundant memory cells 3B. It is understood that array 2 may have other sizes and/or configurations.

Memory device 1 may include address decode circuitry for decoding an address value 7 received by memory device 1. Row decode circuit 8 receives a portion of the received address value 7 and includes a plurality of outputs that are connected to row lines 4 of array 2. Row decode circuit 8 asserts a signal appearing on one of row lines 4 based upon the received address value 7, as is understood in the art. Column decode circuit 9 likewise receives a portion of the received address, value 7 and couples one or more data input/output terminals 10 of memory device 1 to one or more column input/output lines 12 (that are coupled to column lines 5), based upon the received address value 7. Read-write circuit 11 receives input control signals and configures the direction of and control over the data path(s) between column lines 5 and data input/output terminals 10.

The data input/output terminals 10 are shown in FIG. 1 as being bidirectional. It is understood that memory device 1 may have data input terminals that are separate from data output terminals.

Memory device 1 includes redundancy control circuitry for selectively replacing defective memory cells 3A with redundant memory cells 3B so as to improve the yield of memory device 1. In particular, the redundancy control circuitry selectively couples some of the column lines 5 to column input/output lines 12 and selectively decouples at least one column line 5 from the column input/output lines 12, based upon the received address value. In this way, the redundancy control circuitry is capable of selectively decoupling from the column input/output lines 12 a column line associated with a defective memory cell 3A, and coupling to the column input/output lines 12 a column line 5 associated with a redundant memory cell 3B. Some of the coupled column input/output lines 12 are thereafter coupled to data input/output terminals 10 via column decode circuit 9 for providing/receiving data values in performing a memory access operation.

Initially, column decode circuit 9 is controlled to initially connect the column input/output lines 12 to the column lines 5 associated with the columns of addressable and/or accessible memory cells 3A. In the event an addressable memory cell 3A is found to be defective, the redundancy control circuitry may be configured to shift the column input/output line 12 initially associated with the defective memory cell 3A to either another addressable memory cell 3A or a redundant memory cell 3B. In the disclosed embodiment of the present invention, the column input/output line 12 initially connected to the column line 5 associated with the defective memory cell 3A is shifted to a column line 5 associated with a memory cell 3A having a greater column address value (i.e., the numbered position of the memory cell 3A in the row of memory cells) than the column address value of the defective memory cell 3A.

In addition, each column input/output line 12 initially connected to an addressable memory cell 3A having a column address value that is greater than the column address value of the defective memory cell 3A is similarly shifted to a column line 5 having an even greater column address value. The column input/output lines 12 initially connected to column lines S associated with memory cells 3A at the end of array 2 are shifted to the column lines 5 associated with redundant memory cells 3B. In this way, the column line 5 associated with the defective memory cell 3A is bypassed from being connected to a column input/output line 12, thereby being rendered unaddressable and/or inaccessible.

In the disclosed embodiment of the present invention, memory cells 3A are bypassed and/or decoupled from the column input/output lines 12 in blocks of successively disposed memory cells, such as in lengths of bytes or words. It is understood, however, that memory cells 3A may be bypassed/decoupled in block sizes other than widths of bytes or words.

The redundancy control circuitry may include redundancy switching circuit 15 and redundancy address compare circuit 16. Redundancy switching circuit 15 performs the above-described shifting operations under control of redundancy address compare circuit 16. A fuse circuit 17 generates signals RFUSE and CFUSE that identify the particular row and column line 5 that are connected to the defective memory cell 3, respectively. Redundancy address compare circuit 16 receives signals RFUSE and CFUSE, compares signal RFUSE with the decoded row signal provided by row decode circuit 8, and generates control signals PROG<0:10> based upon the comparison. Control signals PROG<0:10> are thereupon used to control redundancy switching circuit 15, as described below.

It is noted that the fuse circuit 17 may be other circuits that are programmable and/or programmed.

In carrying out the above-described shifting operations, redundancy switching circuit 15 may include a plurality of transmission gates that are controlled by redundancy address compare circuit 16 for switching each column input/output line 12 between at least two column lines 5. The transmission gates are connected so as to perform a demultiplexing operation in order to connect a column input/output line 12 to one of a plurality of column lines 5.

Figure 2:
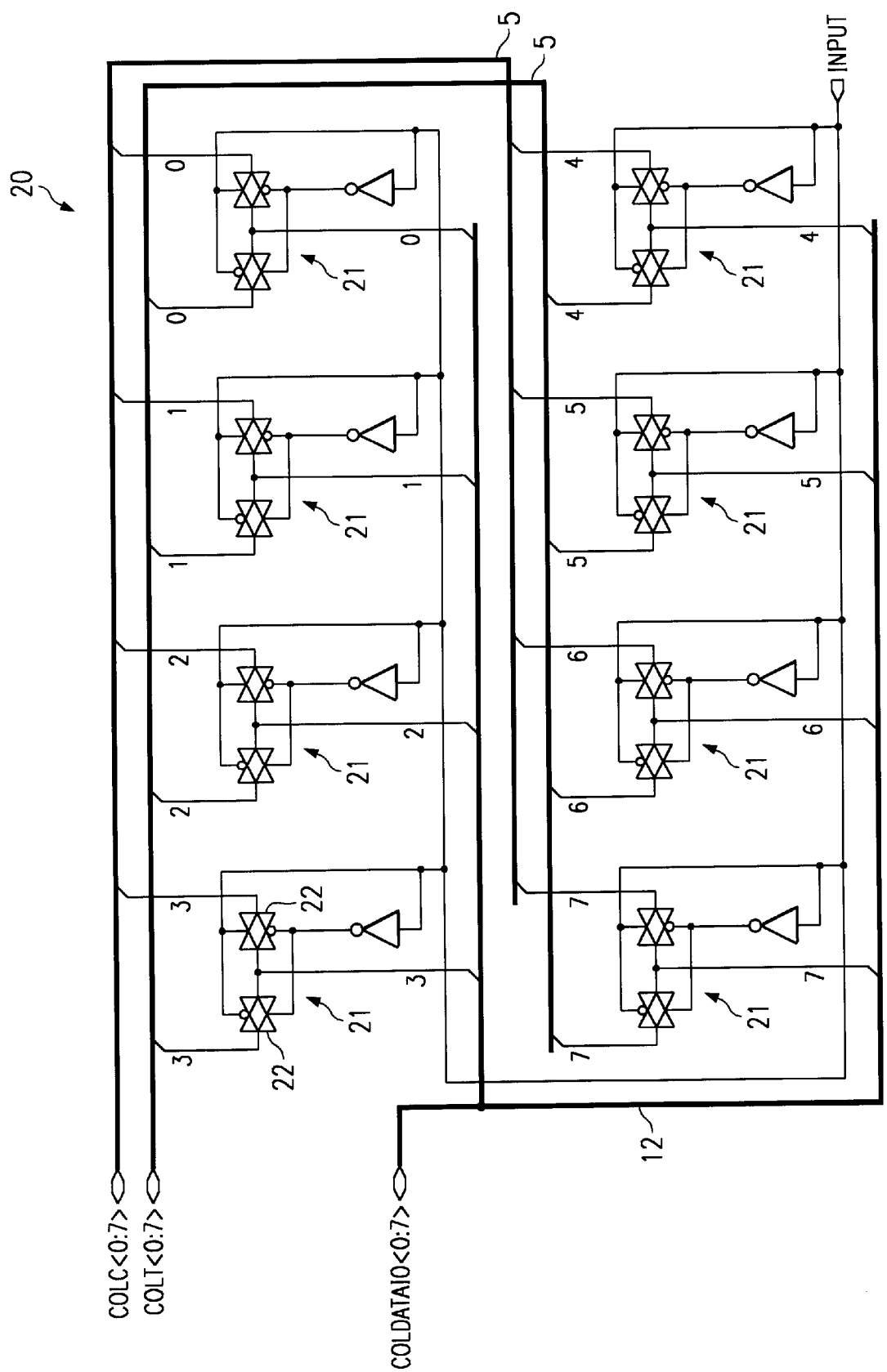
FIG. 2 is a schematic of a switching circuit according to an embodiment of the present invention.

Referring to FIG. 2, there is shown an implementation of a transmission gate circuit 20 of redundancy switching circuit 15 for a block of eight column input/output lines 12, in accordance with an embodiment of the present invention. A pair 21 of transmission gates 22 are connected to each bit of bus COLDATAIO<0:7>. As can be seen, each transmission gate pair 20 is connected to perform a multiplexing operation, under control of input signal INPUT. With each column input/output line 12 being connected to a bit of bus COLDATAIO<0:7> and column lines 5 being connected to buses COLT<0:7> and COLC<0:7>, column input/output line 12 is selectively connected to either of two column lines 5.

Figure 3:
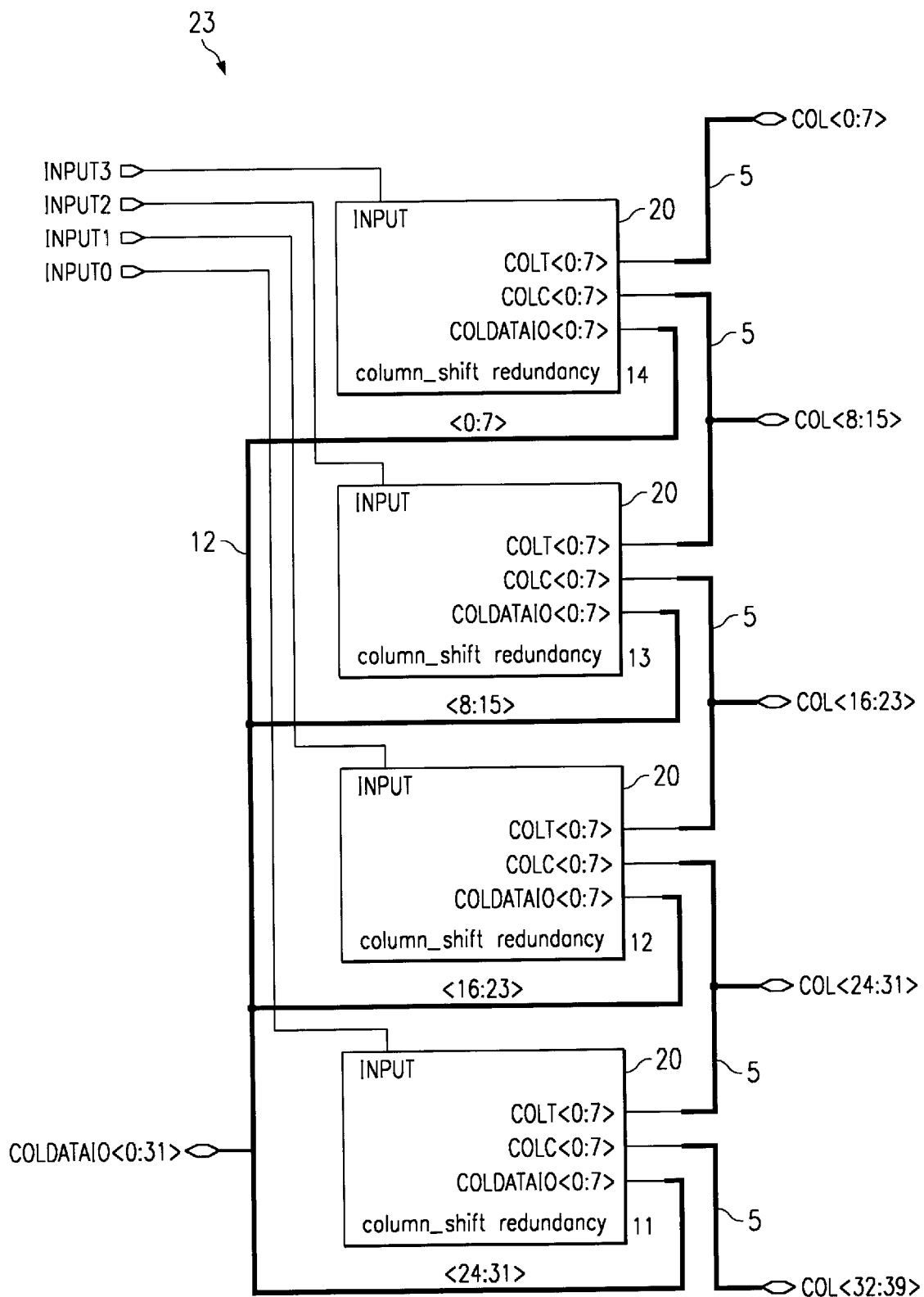
FIG. 3 is a block diagram of multiple switching circuits of FIG. 2.

FIG. 3 illustrates a block diagram of a column shift circuit 23 of redundancy switching circuit 15 showing four instances of the transmission gate circuit 20 shown in FIG. 2. The block diagram shows how the shifting/ demultiplexing operation is accomplished. As stated above, the bus COLDATAIO bus in FIG. 3 is connected to some of the column input/output lines 12. Both the COLT and COLC output busses of the transmission gate circuits 20 form the bus COL, which is connected to the column lines 5 of memory array 2. The COLC bus from one transmission gate circuit 20 is connected to the COLT bus from another transmission gate circuit 20. The transmission gate circuits 20 are arranged so that eight column input/output lines 12 are shifted together in a group. The transmission gate circuits 20 are arranged so that the COLC bus from a transmission gate circuit associated with a first group of column input/output lines 12 is connected to the COLT bus from the transmission gate circuit 20 associated with a second block of column input/output lines 12 that are adjacent to the first group of column input/output lines 12.

Figure 4A:
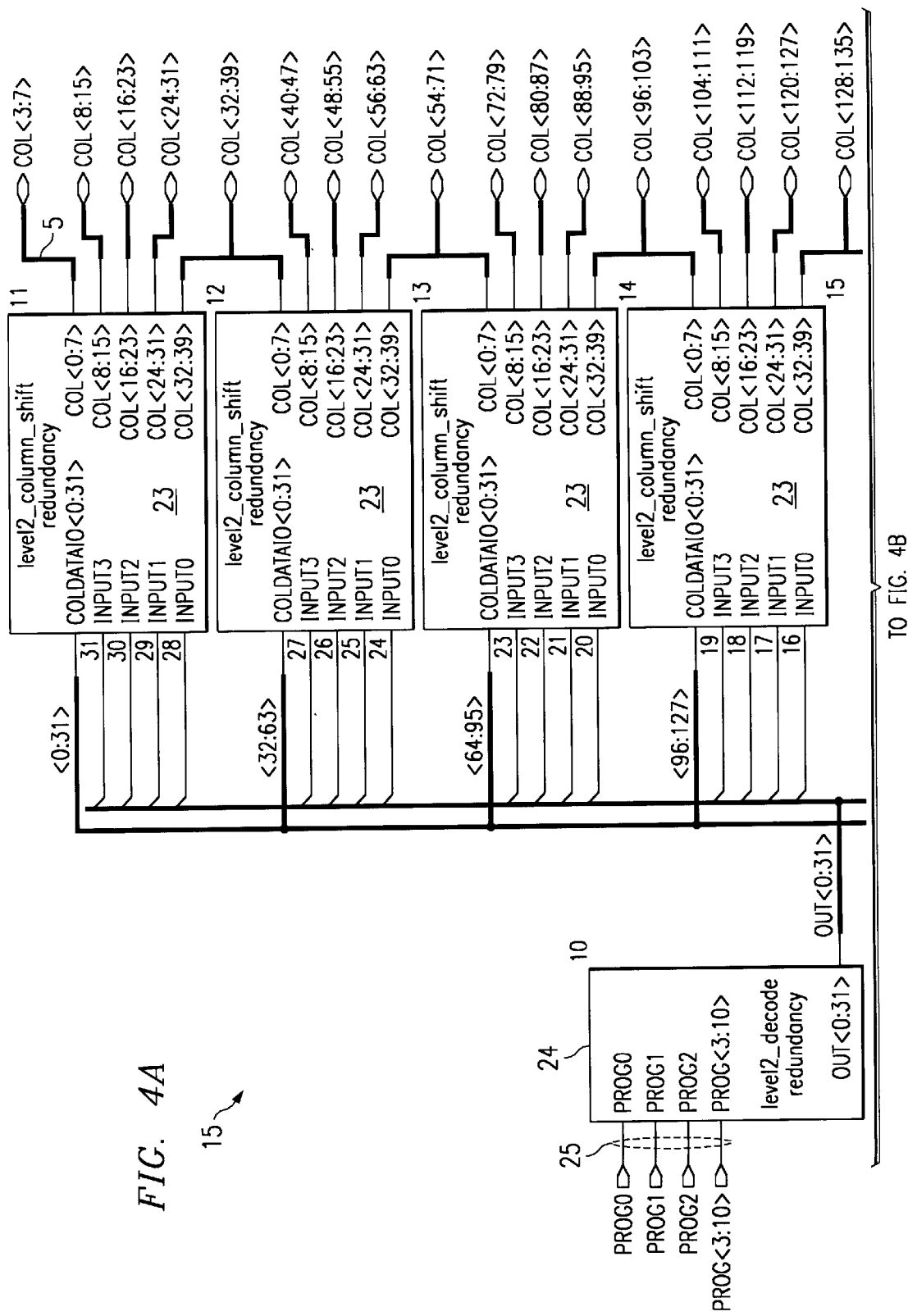
FIG. 4 is a block diagram of the redundancy switching circuitry shown in FIG. 1.
Figure 4B:
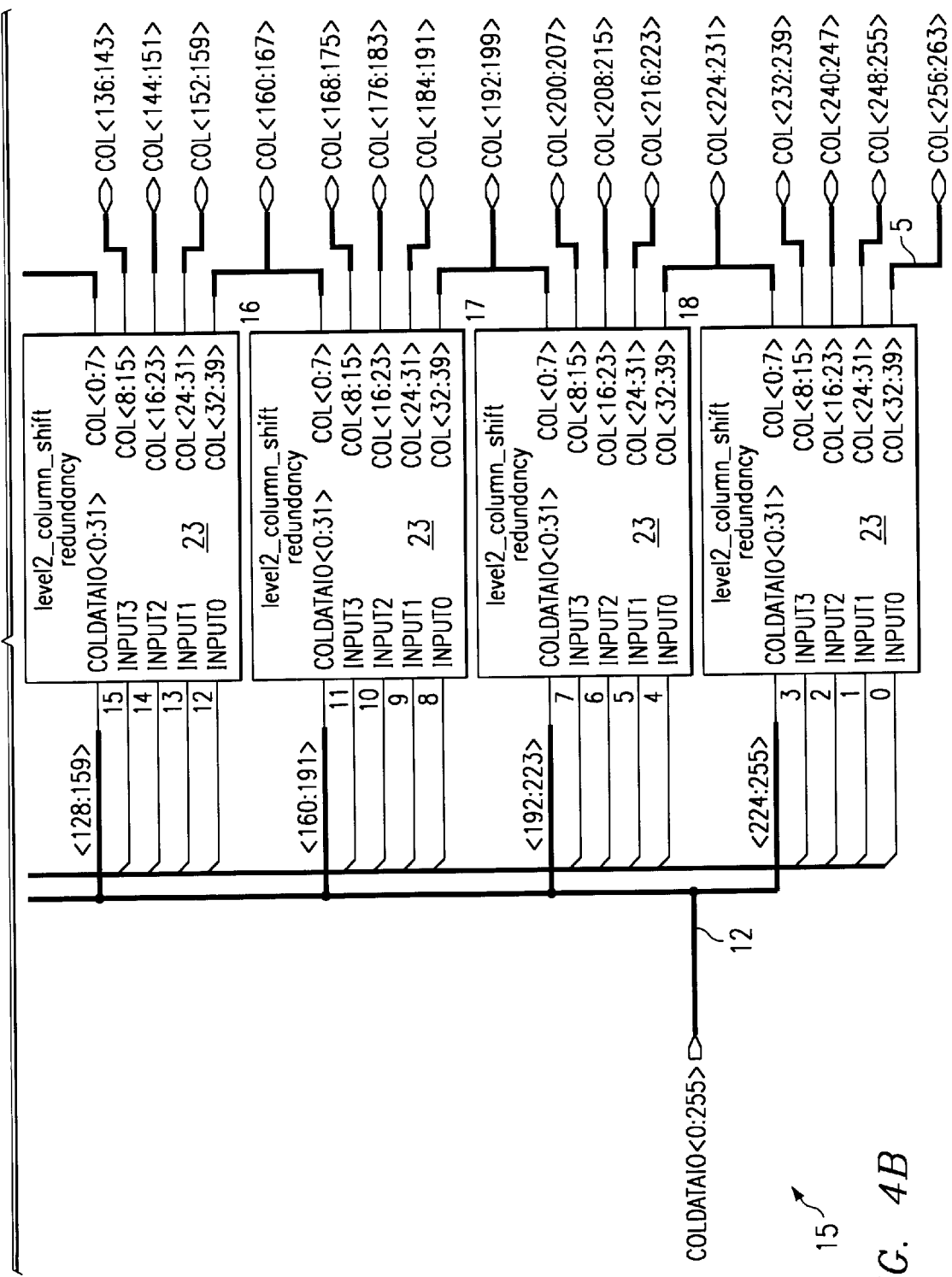

FIG. 4 is a block diagram of the top level schematic of redundancy switching circuit 15, showing eight column shift circuits 23 of FIG. 3. Redundancy switching circuit 15 further includes redundant column decode circuit 24 which receives a column address value 25 corresponding to the defective memory cell 3A and generates an output bus OUT, each bit of which drives the input signal INPUT of a distinct transmission gate circuit 20. Column decode circuit 24 decodes the column address value 25 so that the group of column input/output lines 12 having the column input/output line 12 corresponding to column address value 25 is shifted. In addition, the groups of column input/output lines 12 having column address values that are greater than the column address value 25 are shifted. The groups of column input/output lines 12 having column address values that are less than the column address value 25 are not shifted. In this way, the column input/output lines 12 are connected to most all of the groups of column lines 5 except for the group of column lines 5 having the column line associated with the defective memory cell.

Figure 5:
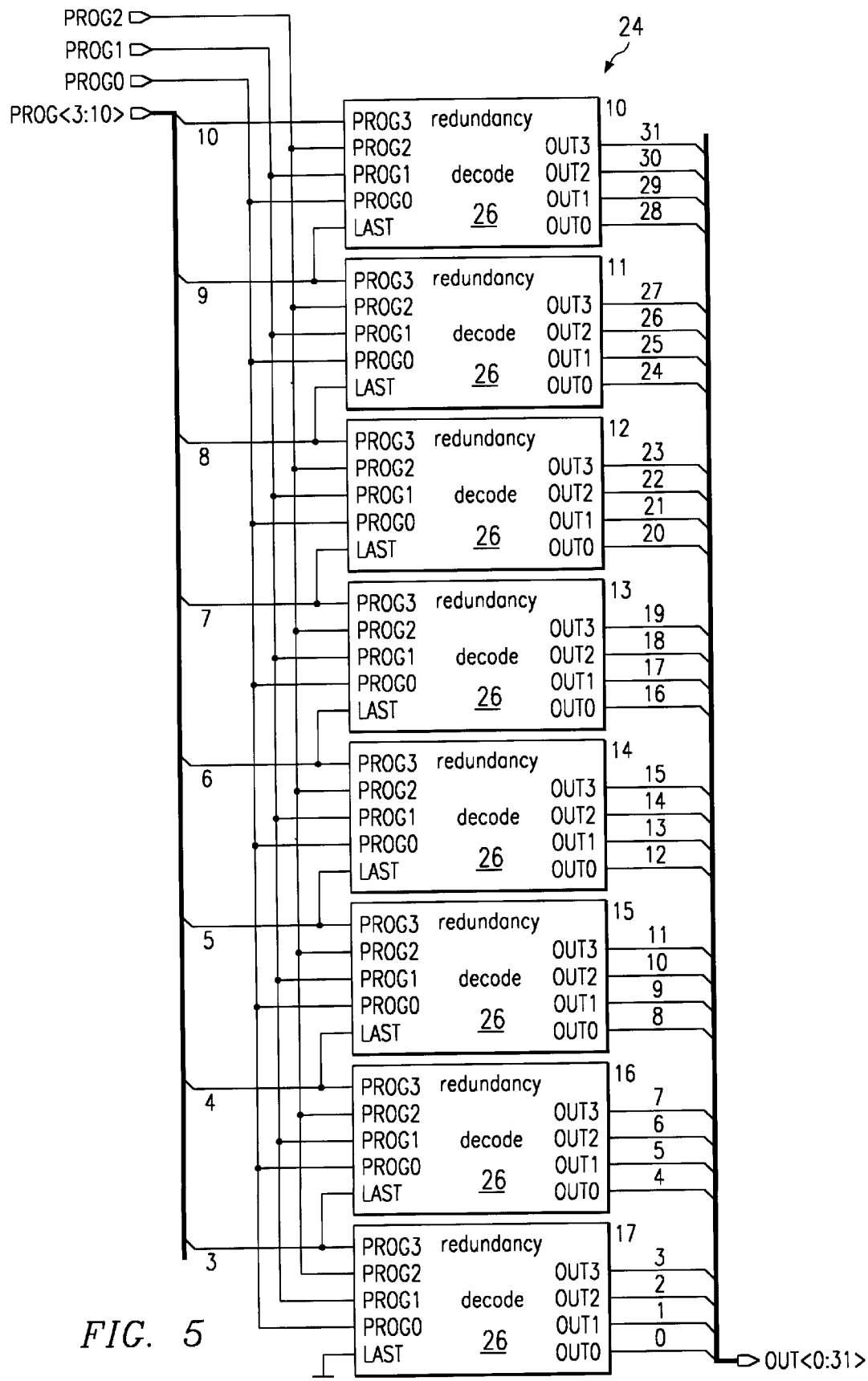
FIG. 5 is a block diagram of a decode circuit of FIG. 1.
Figure 6:
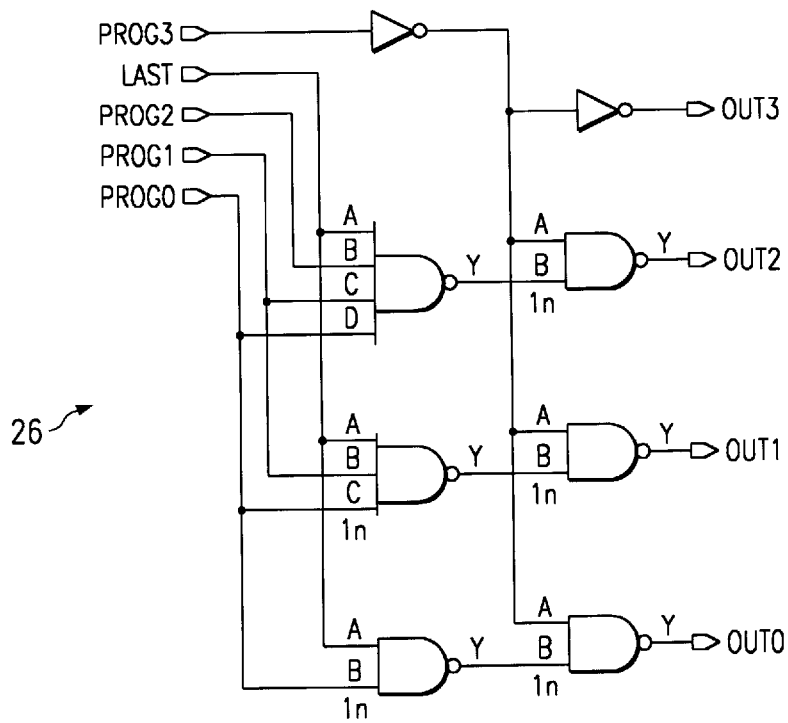
FIG. 6 is a schematic of one of the decode circuits in FIG. 5.

FIGS. 5 and 6 illustrate the implementation of redundant column decode circuit 24. FIG. 5 is a top level block diagram of the redundant column decode circuit 24. As can be seen, redundant column decode circuit 24 includes eight decode subcircuits 26. Each decode subcircuit 26 is shown in FIG. 6. In the disclosed embodiment of the present invention, redundant column decode circuit 24 receives an eleven bit encoded bus PROG<0:10> and generates 32 bit bus OUT<0:31>.

Redundant column decode circuit 24 is implemented without ripple circuitry that disadvantageously increases propagation/circuit delays through redundant column decode circuit 24. In particular, bit signals PROG<0:2> of input bus PROG<0:10> drive the PROG0, PROG1 and PROG2 inputs, respectively, of each decode subcircuit 26. Each PROG3 input of decode subcircuit 26 is driven by a distinct bit signal from PROG<3:10>. Input signal LAST of each decode subcircuit 26 is driven from the same bit signal of PROG<3:10> that drives the PROG3 input of an adjacent decode subcircuit 26. In this implementation, the greatest number of logic gates from input bus PROG<0:10> to output bus OUT<0:31> of redundant column decode circuit 24 is two.

As described above, redundancy address compare circuit 16 controls the shifting and/or coupling/decoupling operation of redundancy switching circuit 15. Redundancy address compare circuit 16 receives the address provided by row decode circuit 8, compares the received address with signals RFUSE<0:11> provided by fuse circuit 17, and generates bus PROG<0:10> that is input to redundant column decode circuit 24. In the event the selected row line 4 has a defective memory cell, the value placed on bus PROG<0:10> generated by redundancy address compare circuit 16 identifies the particular column line 5 connected to the defective memory cell which needs to be decoupled from the column input/output lines 12.

Figure 7:
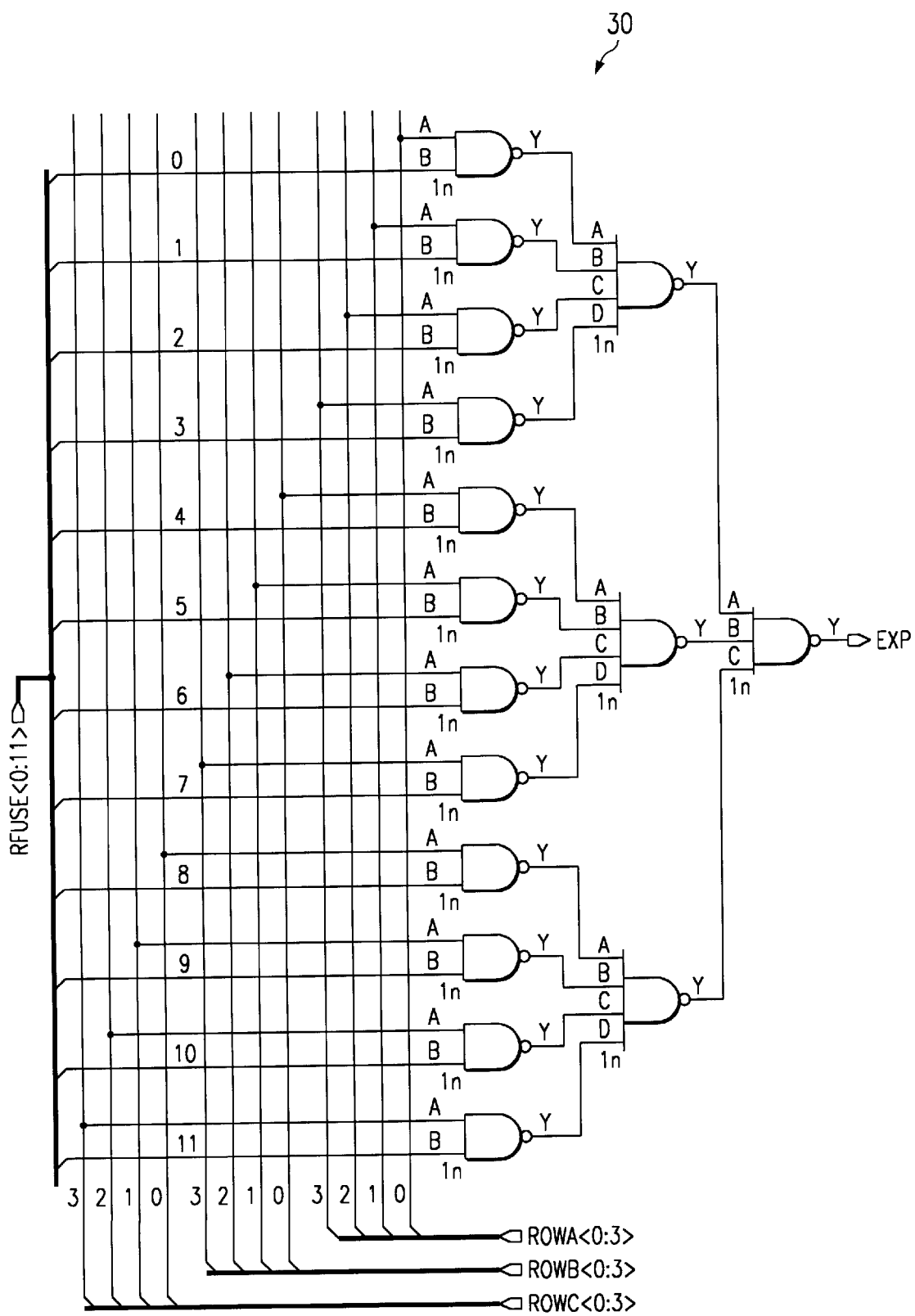
FIG. 7 is a schematic of a row compare circuit of the embodiment of the present invention of FIG. 1.

FIG. 7 illustrates a row compare circuit 30 of redundancy address compare circuit 16. Row compare circuit 30 receives the decoded row address provided by row decode circuit 8 and bus RFUSE provided by fuse circuit 17, and generates signal EXP having a value that is indicative of a comparison between the decoded row address and RFUSE. In the disclosed embodiment of the present invention, the decoded row address is formed from three groups of four individual bit values, ROWA<0:3>, ROWB<0:3> and ROWC<0:3>. In decoding the eight bit wide received address value 7, only one bit value from each of ROWA<0:3>, ROWB<0:3> and ROWC<0:3> is asserted at one time by row decode circuit 8. As shown in FIG. 7, row compare circuit 30 asserts output signal EXP if any one signal of ROWA, ROWB and ROWC and the corresponding bit signal of RFUSE are asserted, thereby indicating that the decoded address value provided by row decode circuit 8 matches the row address value of the row having the defective memory cell 3.

Figure 8:
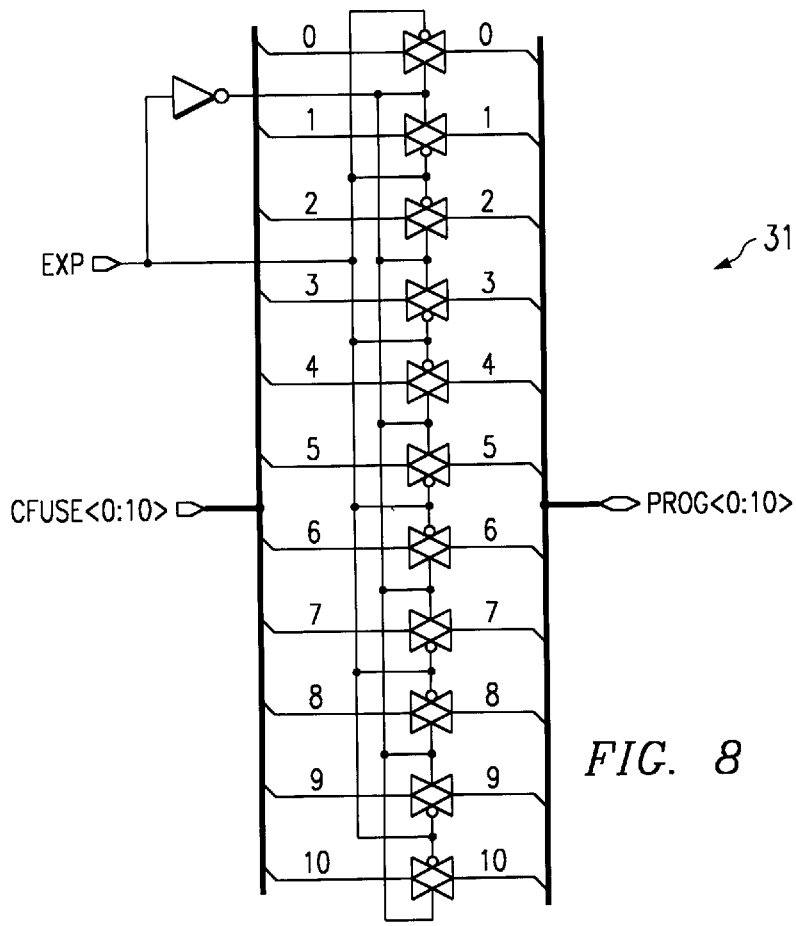
FIG. 8 is a column address generation circuit according to the embodiment of the present invention.

FIG. 8 is a schematic of a column address generation circuit 31 according to the disclosed embodiment of the present invention. Column address generation circuit 31 receives the signal EXP provided by row compare circuit 30 and the bus CFUSE<0:10> generated by fuse circuit 17, and generates bus PROG<0:10>. As can be seen, if signal EXP is asserted, bus PROG is connected to bus CFUSE. If EXP is not asserted, bus PROG is disconnected from bus CFUSE.

Figure 9:
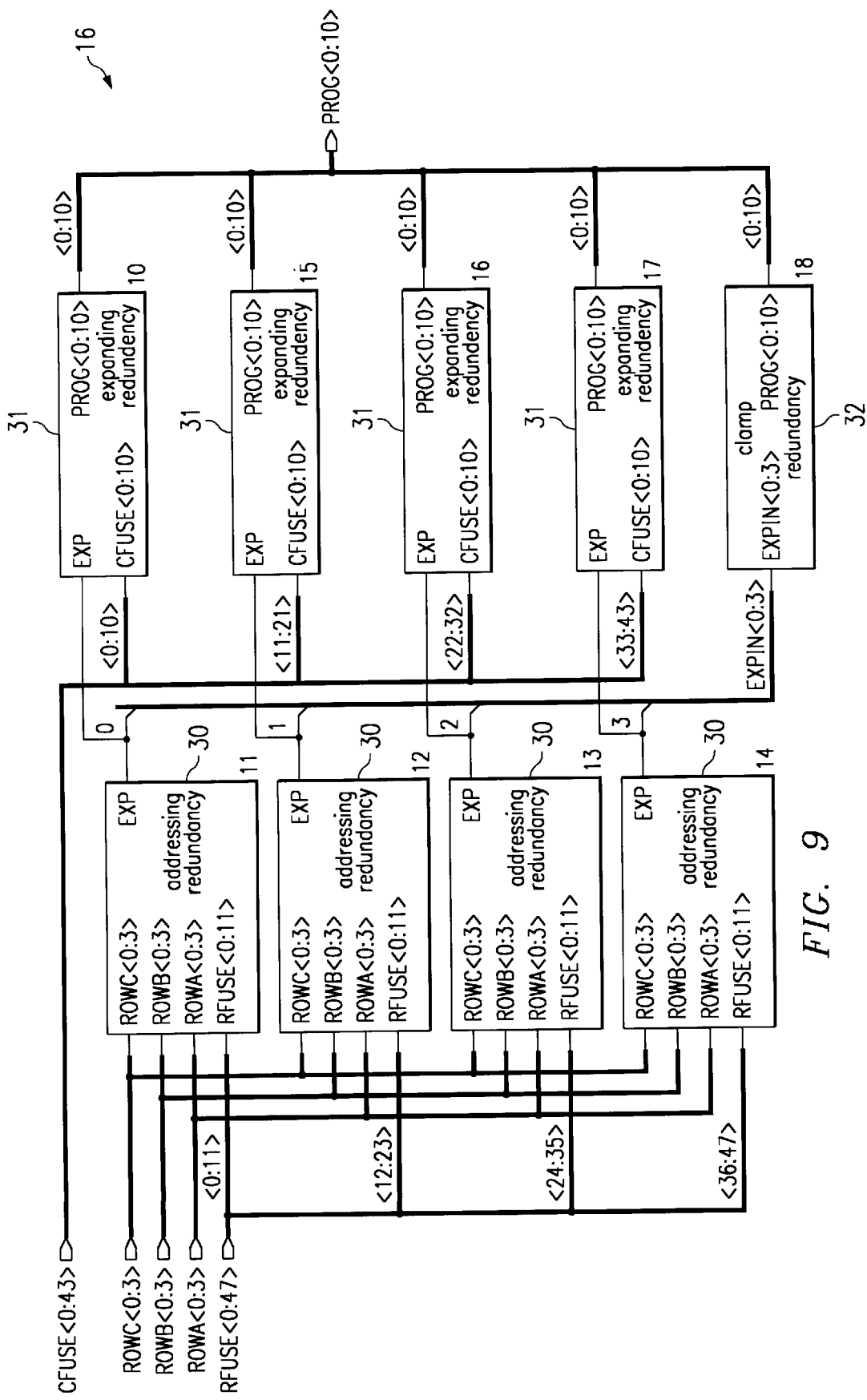
FIG. 9 is a block diagram of a redundancy address compare circuit of FIG. 1.

FIG. 9 is a top level diagram of redundancy address compare circuit 16. As shown, four pairs of row compare circuits 30 and column address generation circuits 31 are utilized in order to bypass up to four defective memory cells 3. Bus PROG<0:10>, which is input to redundant column decode circuit 24 of redundancy switching circuit 15, is connected to the PROG bus output of each column address generation circuit 31 due to the capability of each column address generation circuit 31 to selectively drive bus PROG. In this case, the decoded row address busses ROWA, ROWB and ROWC are applied to each of the four row compare circuits 30. In addition, a distinct set of bits from bus RFUSE<0:47> are applied as the RFUSE input to each of the four row compare circuits 30.

Figure 10:
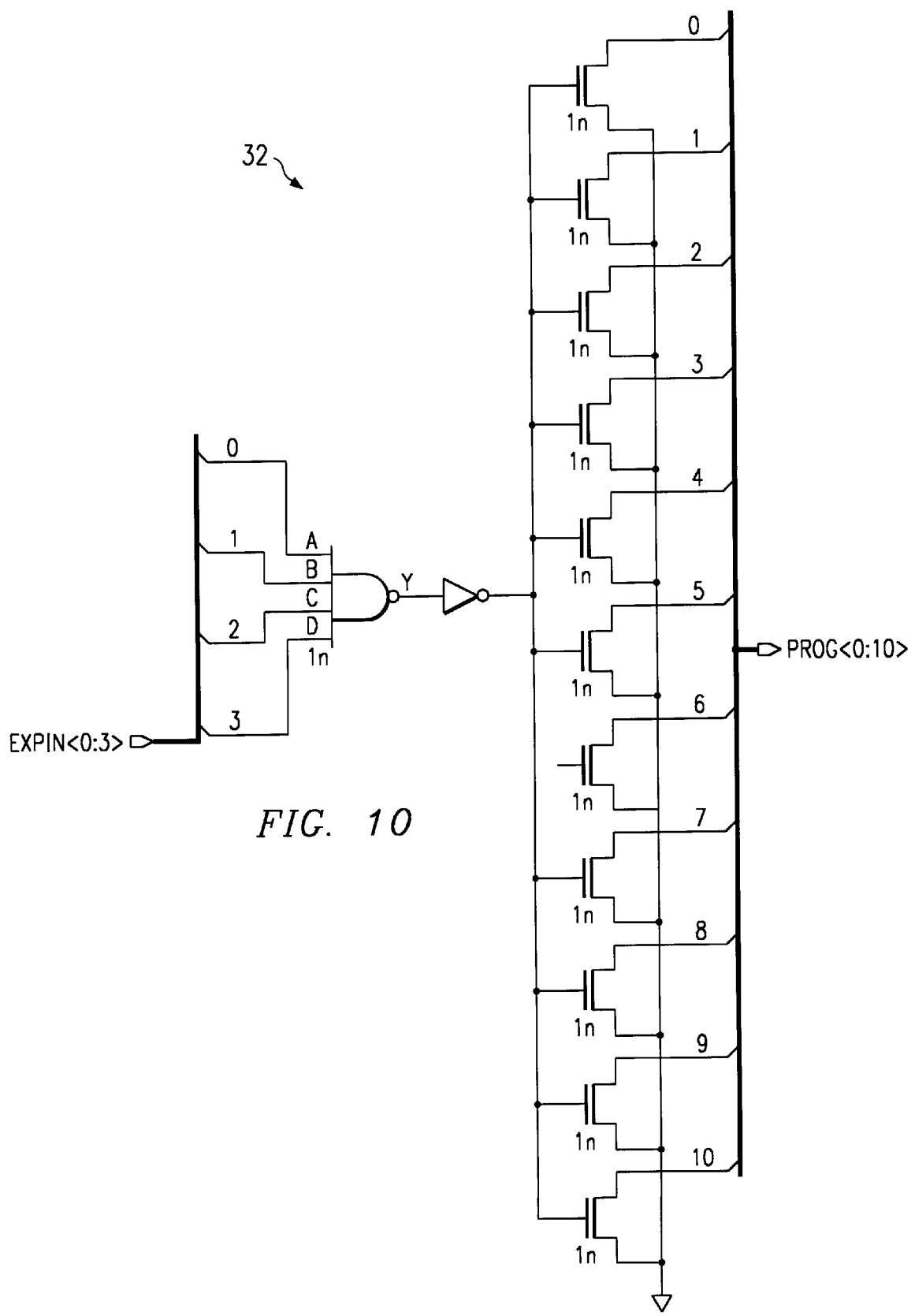
FIG. 10 is a column default address generation circuit in FIG. 9.

Redundancy address compare circuit 16 further includes a default column address generation circuit 32 which receives the output signal EXP from each row compare circuit 30 and drives bus PROG<0:10> to a value that indicates that no shifting should occur. In other words, if the decoded row address provided to redundancy address compare circuit 16 does not match any row address bus RFUSE, thereby indicating that there is no defective memory cells in the selected row, then default column address generation circuit 32 provides an indication to redundancy switching circuit 15 not to perform a shifting operation as described above. FIG. 10 illustrates an implementation of the default column address generation circuit 32 according to the disclosed embodiment of the present invention. As can be seen, each bit of bus PROG<0:10> is tied to a ground potential in the event no column address generation circuit 30 drives bus PROG.

Figure 11:
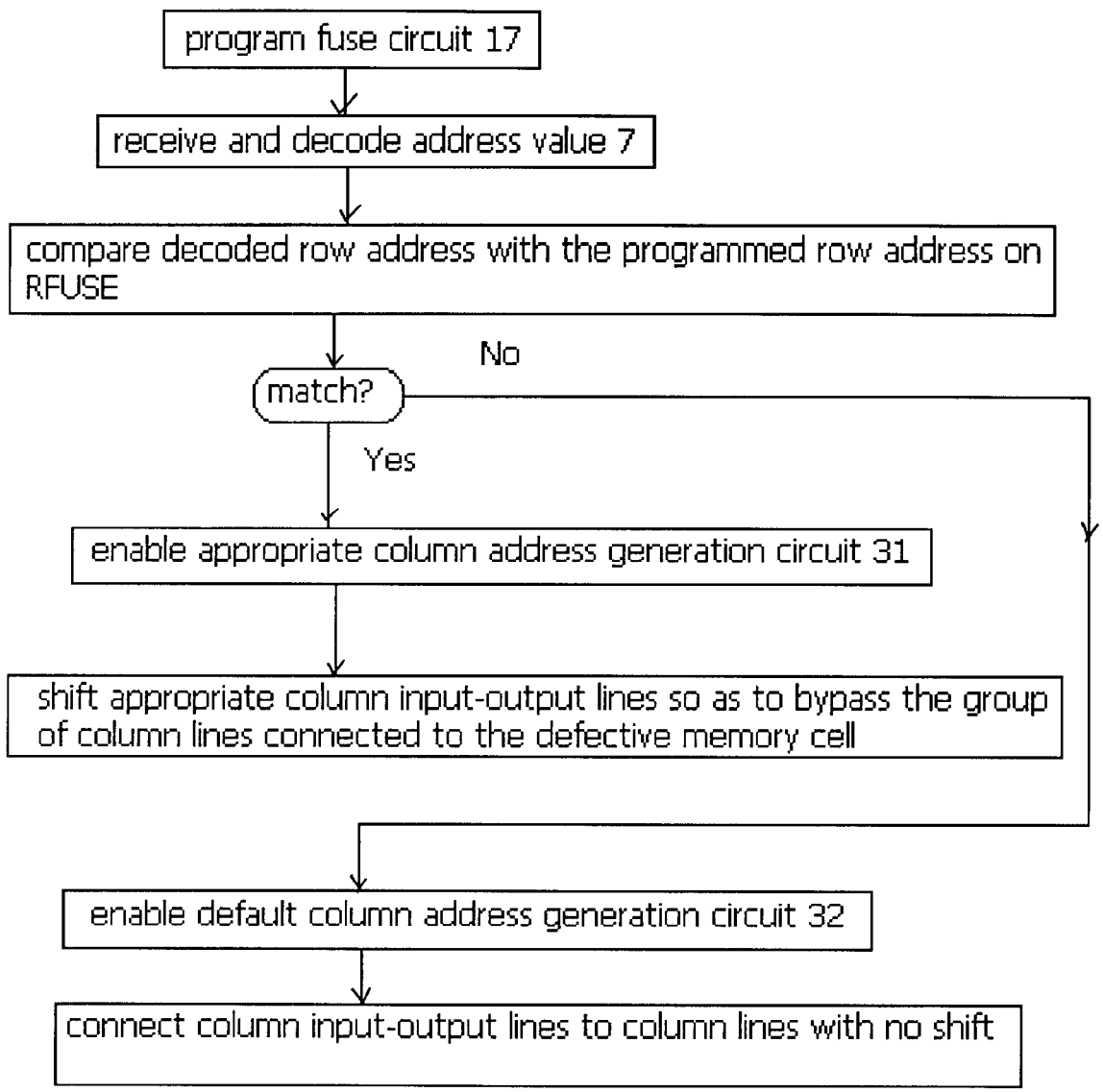
FIG. 11 is a flowchart illustrating an operation of the present invention.

The operation of memory device 1 to bypass access to a defective memory cell 3 will be described with reference to FIG. 11. Initially, it is assumed that memory device 1 had been tested and at least one defective memory cell 3 detected. Fuse circuit 17 is then programmed to generate a signal appearing on one of the RFUSE busses and a corresponding signal appearing on the corresponding CFUSE bus that identifies the location of the defective memory cell 3. At this point, the defective memory cell 3 is inaccessible.

During the course of a memory access operation, row decode circuit 8 decodes a received address value 7 and provides a decoded row address value to redundancy address compare circuit 16 on busses ROWA, ROWB and ROWC. Each row compare circuit 30 then compares the decoded row address value on ROWA, ROWB, and ROWC with the programmed row address value provided on the corresponding RFUSE buss from fuse circuit 17. If there is a match between the decoded row address value and one of the programmed row address values, then the column address generator circuit 31 associated with the row compare circuit 30 providing the match is enabled to provide on bus PROG<0:10> the value appearing on bus CFUSE connected to the enabled column address generator circuit 31. For purposes of illustration, it is assumed that the value appearing on the CFUSE bus of the enabled column address generator circuit 31 identifies the third block of eight column lines 5 as being associated with a defective memory cell 3.

Once the value appearing on the CFUSE bus of the enabled column address generation circuit 31 is placed on bus PROG, column decode circuit 24 decodes the value places a decoded address value on bus OUT<0:31> corresponding thereto. In this example, since the CFUSE bus identifies the third group of eight column lines 5 as being associated with a defective memory cell 3, the value appearing on the OUT bus is such that the OUT<31> and OUT<30> are de-asserted and the remaining bits, OUT<0:29>, are asserted. This results in the first two groups of column input/output lines 12 (i.e., the column input/output lines connected to COLDATAIO<0:15>) being connected to the first two groups of column lines 5 (i.e., the column lines connected to COL<0:15>); and the groups 3–32 of column input/output lines 12 (i.e., column input/output lines 12 connected to COLDATAIO<16:255>) being shifted by one group of column lines so as to be connected to bus COL<24:263> (i.e., groups 4–33 of column lines 12). This results in the third group of column lines 5 being disconnected from column input/output lines 12 and therefore renders inaccessible the memory cells 3 connected to the third group of column lines 5, during the memory access operation.

Alternatively, in the event a memory access operation is initiated and the decoded row address value generated by row decode circuit 8 does not match any RFUSE bus provided by fuse circuit 17, the bits of bus PROG are de-asserted by default column address generation circuit 32, which causes column input/output lines 12 to be unshifted and connected to groups 1–32 of column lines 5 (i.e., the column lines 5 connected to COL<0:255>).

The disclosed embodiment of the present invention thereby allows for effectively replacing defective memory cells in any row of memory cells with redundant memory cells in a relatively small number of columns of memory cells, under control of redundancy switching circuit 15 and redundancy address compare circuit 16. In other words, the column lines 5 of redundant memory cells 3B can be utilized to replace any defective memory cell 3A appearing in any row of array 2.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. Redundancy circuitry for a memory device having an array of memory cells organized in rows and columns, each row of memory cells including a set of one or more redundant memory cells, the redundancy circuitry comprising:
   a first circuit for comparing a row address value corresponding to a first row of memory cells having a defective memory cell with a received address value received by the memory device;
   a second circuit, responsive to the comparison, for identifying a defective memory cell in the first row of memory cells; and
   a third circuit, responsive to the second circuit, for including the set of one or more redundant memory cells in the first row of memory cells as one or more accessible memory cells, and excluding the defective memory cell in the first row of memory cells from being an accessible memory cell.

2. The redundancy circuitry of claim 1, wherein:
   the array includes a plurality of column lines, each column line being connected to a column of memory cells;
   the memory device includes a plurality of column input/output lines coupled to the column lines; and
   the third circuit selectively shifts a column input/output line from the column line connected to the defective memory cell to a column line connected to another memory cell in the first row of memory cells.

3. The redundancy circuitry of claim 2, wherein:
   the third circuit selectively shifts a column input/output line from a column line connected to a memory cell in the first row of memory cells to a column line connected to a redundant memory cell in the first row of memory cells.

4. The redundancy circuitry of claim 1, wherein:
   the set of one or more redundant memory cells comprises a predetermined number of redundant memory cells greater than one; and
   the third circuit includes each of the redundant memory cells in the first row of memory cells as an accessible memory cell, and excludes a predetermined number of successively disposed memory cells, including the defective memory cell, from being accessible memory cells, the predetermined number of successively disposed memory cells being equal to the predetermined number of redundant memory cells.

5. The redundancy circuitry of claim 4, wherein:
   the predetermined number corresponds to a number of data bits in a byte of data.

6. The redundancy circuitry of claim 4, wherein:
   the predetermined number corresponds to a number of data bits in a word of data.

7. The redundancy circuitry of claim 1, wherein:
   the second circuit identifies a first group of column lines connected to successively disposed memory cells including the defective memory cell; and
   the third circuit selectively shifts column input/output lines from connection to the first group of column lines to connection to a second group of column lines connected to memory cells having address values that are greater than the address values connected to the first group of column lines.

8. The redundancy circuitry of claim 1, wherein the third circuit comprises:

transmission gate circuitry including a plurality of transmission gates grouped into pairs of transmission gates, each pair of transmission gates having a first input/output coupled to a distinct column input/output line of the memory device, a second input/output coupled to a first column of memory cells, and a third input/output coupled to a second column of memory cells, the column input/output line being selectively coupled to the second input/output and the third input/output.

9. The redundancy circuitry of claim 8, wherein:

the column input/output line is coupled to the second input/output and the third input/output based upon the position of the column input/output line relative to the column line connected to the defective memory cell.

10. The redundancy circuitry of claim 8, wherein:

the pairs of transmission gates are organized into a plurality of blocks; and the third circuit further comprises decode circuitry having a plurality of outputs, each output being connected to a distinct block of pairs of transmission gates.

11. The redundancy circuitry of claim 10, wherein:

the decode circuitry connects the first input/output to the third input/output for each block of pairs of transmission gates corresponding to memory cells in blocks of memory cells appearing on a first side of the block of memory cells having the defective memory cell, and connects the first input/output to the second input/output for each block of pairs of transmission gates corresponding to memory cells in blocks of memory cells appearing on a second side of the block of memory cells having the defective memory cell.

12. The redundancy circuit of claim 10, wherein:

the decode circuitry receives an output of the second circuit.

13. The redundancy circuitry of claim 1, wherein:

the first circuit includes a programmed circuit.

14. The redundancy circuit of claim 1, wherein:

the second circuit includes a programmable circuit.

15. A method of replacing a defective memory cell in a first row of memory cells in a memory cell array organized into rows and columns of memory cells, the first row of memory cells including redundant memory cells, the method comprising:

comparing a row address value corresponding to the first row of memory cells to a received address value received during a memory access operation;

responsive to the comparing, identifying the defective memory cell in the first row of memory cells; and responsive to the identifying, including at least one of the redundant memory cells in the first row of memory cells as at least one accessible memory cell, and excluding the defective memory cell in the first row of memory cells from being an accessible memory cell.

16. The method of claim 15, wherein:

the memory device includes a plurality of column lines connected to the columns of memory cells and a plurality of column input/output lines; and the including of the at least one redundant memory cell and the excluding of the defective memory cell comprises shifting a column input/output line from connection to the column line connected to the defective memory cell to connection a column line connected to another memory cell in the first row of memory cells.

17. The method of claim 16, wherein:

the including of the at least one redundant memory cell and the excluding of the defective memory cell comprises shifting a column input/output line to connection to a column line connected to the at least one redundant memory cell.

18. The method of claim 15, wherein:

the including of the at least one redundant memory cell comprises including a plurality of redundant memory cells as accessible memory cells; and the excluding of the defective memory cell comprises excluding a plurality of memory cells from being accessible memory cells, the plurality of excluded memory cells being successively disposed memory cells including the defective memory cell.

19. The method of claim 18, wherein:

the number of included redundant memory cells and the number of excluded memory cells correspond to a number of data bits in a byte of data.

20. The method of claim 18, wherein:

the number of included redundant memory cells and the number of excluded memory cells correspond to a number of data bits in a word of data.

21. The method of claim 15, further comprising:

the memory device includes a plurality of column lines connected to the columns of memory cells and a plurality of column input/output lines; and grouping successively disposed memory cells in the first row of memory cells into a plurality of groups;

the including of the at least one redundant memory cell and the excluding of the defective memory cell comprises shifting column input lines initially connected to a group of column lines associated with the defective memory cell to another group of column lines.

22. The method of claim 15, further comprising:

programmably storing the address value of the first row of memory cells in the memory device.

23. A memory device, comprising:

an array of memory cells organized into rows and columns of memory cells, each row of memory cells including a plurality of addressable memory cells and redundant memory cells, the array of memory cells including row lines and column lines, each row line being coupled to memory cells in a distinct row of memory cells, each column line being coupled to memory cells in a distinct column of memory cells, and column input/output lines;

an address decoder for receiving an address value during a memory access operation and selecting a row of memory cells and coupling a plurality of column input/output lines to the data input/output terminals of the memory device, based upon the received address value; and redundancy circuitry for selectively coupling column lines for the redundant memory cells in the selected row to column input/output lines of the array of memory cells and selectively decoupling at least one column line for a defective one of the addressable memory cells in the selected row from the column input/output lines, based upon the received address value.

24. The memory device of claim 23, wherein:

the redundancy circuitry compares the received address value to an address value corresponding to a row of memory cells having a defective memory cell, and based upon the comparison, selectively decouples from the column input/output lines the column line coupled associated with the defective memory cell and selectively couples to the column input/output lines a column line associated with a redundant memory cell.

25. The memory device of claim 24, wherein:

based upon the comparison, the redundancy circuitry selectively shifts the column input/output line initially assigned to the column line associated with the defective memory cell to a column line that is not associated with the defective memory cell.

26. The memory device of claim 24, wherein:

the redundancy circuitry connects each column input/output line to any of at least two column lines, based upon the comparison.

27. The memory device of claim 26, wherein the redundancy circuitry comprises:

a plurality of transmission gate pairs, each transmission gate pair being connected to a distinct column input/output line and to two column lines; and decode circuitry for selectively activating individual transmission gates of each transmission gate pair, based upon the comparison.

28. The memory device of claim 27, wherein:

the decode circuitry receives a column address value corresponding to the location of the defective memory cell in the row of memory cells, and generates decoded output signals for reception by the transmission gates of the transmission gate pairs.

29. The memory device of claim 28, wherein:

the decode circuitry comprises ripple-free circuitry.

30. The memory device of claim 23, wherein:

the redundancy circuitry selectively decouples from the column input/output lines a plurality of column lines, based upon the received address value.

31. The memory device of claim 30, wherein:

the selectively decoupled column lines are associated with the defective memory cell and one or more memory cells successively disposed relative thereto.

32. The memory device of claim 30, wherein:

a number of the selectively decoupled column lines is equal to the number of data bits in a byte of data.

33. The memory device of claim 30, wherein:

a number of the selectively decoupled column lines is equal to the number of data bits in a word of data.

34. The memory device of claim 23, wherein:

the redundancy circuitry generates a defective row address value corresponding to the row of memory cells having a defective memory cell, and a defective column address value corresponding to the column of memory cells associated with the defective memory cell.

35. The memory device of claim 34, wherein:

the redundancy circuitry includes one of programmable circuitry and programmed circuitry for selectively setting the defective row address value and the defective column address value.

36. A redundancy method for use in connection with a memory array having a plurality of rows of memory cells, each row including addressable memory cells and redundant memory cells, the method comprising the steps of:

addressing a certain one of the rows of memory cells;

detecting that the addressed certain row of memory cells includes a defective addressable memory cell;

deselecting access to the defective addressable memory cell; and selecting access to one of the redundant memory cells from the same certain row of memory cells as a replacement for the detected and deselected defective addressable memory cell.

37. The method of claim 36 wherein the steps of deselecting and selecting comprise the step of:

shifting a column input/output line from connection to the defective addressable memory cell to instead connect to the one of the redundant memory cells.

38. The method of claim 37 wherein the step of shifting comprises the step of shifting a plurality of column input/output lines for a block of addressable memory cells which include the defective addressable memory cell to instead connect to a block of the redundant memory cells.

39. The method as in claim 38 wherein the number of memory cells in the block is equal to the number of data bits in a byte of data.

40. The method as in claim 38 wherein the number of memory cells in the block is equal to the number of data bits in a word of data.

41. A memory comprising:

an array having a plurality of rows of memory cells, each row including addressable memory cells and redundant memory cells;

an addressing circuit for addressing a certain one of the rows of memory cells; and a redundancy circuit operating to detect that the addressed certain row of memory cells includes a defective addressable memory cell and, in response thereto, deselect access to the defective addressable memory cell and instead select access to one of the redundant memory cells from the same certain row of memory cells as a replacement for the detected and deselected defective addressable memory cell.

42. The memory of claim 41 wherein the redundancy circuit operation to deselect and select comprises an operation to shift a column input/output line from connection to the defective addressable memory cell to instead connect to the one of the redundant memory cells.

43. The memory of claim 42 wherein the operation to shift comprises the shifting of a plurality of column input/output lines for a block of addressable memory cells which include the defective addressable memory cell to instead connect to a block of the redundant memory cells.

44. The memory as in claim 43 wherein the number of memory cells in the block is equal to the number of data bits in a byte of data.

45. The memory as in claim 43 wherein the number of memory cells in the block is equal to the number of data bits in a word of data.

* * * * *